United States Patent [19]

Vice

[11] Patent Number: 5,513,390
[45] Date of Patent: Apr. 30, 1996

[54] BIASED FET MIXER

[75] Inventor: Michael W. Vice, San Mateo County, Calif.

[73] Assignee: Watkins Johnson Company, Palo Alto, Calif.

[21] Appl. No.: 149,671

[22] Filed: Nov. 9, 1993

Related U.S. Application Data

[63] Continuation-in-part of Ser. No. 4,234, Jan. 14, 1993, Pat. No. 5,361,409, which is a continuation of Ser. No. 668,248, Mar. 12, 1991, abandoned.

[51] Int. Cl.$^6$ ........................................... H04B 1/26
[52] U.S. Cl. ........................ 455/323; 455/333; 333/24 R; 333/245; 327/113
[58] Field of Search ................................ 455/318, 319, 455/323, 326, 327; 330/171, 190, 197; 333/24 R, 119, 131, 245; 327/113

[56] References Cited

U.S. PATENT DOCUMENTS

| | | | |
|---|---|---|---|
| 3,700,928 | 10/1972 | Milberger et al. | 307/268 |
| 4,502,028 | 2/1985 | Leake | 333/245 |
| 4,979,233 | 12/1990 | Kawahata | 455/326 X |
| 5,027,163 | 6/1991 | Dobrovolny | 455/323 X |
| 5,130,678 | 7/1992 | Edwards | 333/24 R |
| 5,140,705 | 8/1992 | Kosuga | 455/326 X |
| 5,153,469 | 10/1992 | Petted et al. | 455/326 X |
| 5,280,648 | 1/1994 | Dobrovolny | 333/119 |

*Primary Examiner*—Edward F. Urban
*Attorney, Agent, or Firm*—Flehr, Hohbach, Test, Albritton & Herbert

[57] ABSTRACT

A mixer including a "reflection" transmission line transformer having at least first and second ports. The ports are connected such that nearly complete coupling of energy between the ports relies on substantially complete reflection of energy at a reference plane of the transformer. In a preferred implementation there is produced at the first port an intermediate frequency (IF) signal and received a DC bias signal via an IF balun. At the second port there is inputted a radio frequency (RF) signal through an RF balun.

The DC bias signal will preferably be provided to a set of phase-selecting GaAs MESFET transistors operatively connected between an LO balun and a third port of the reflection transformer. In the preferred implementation the MESFET transistors are realized using an MMIC.

20 Claims, 8 Drawing Sheets

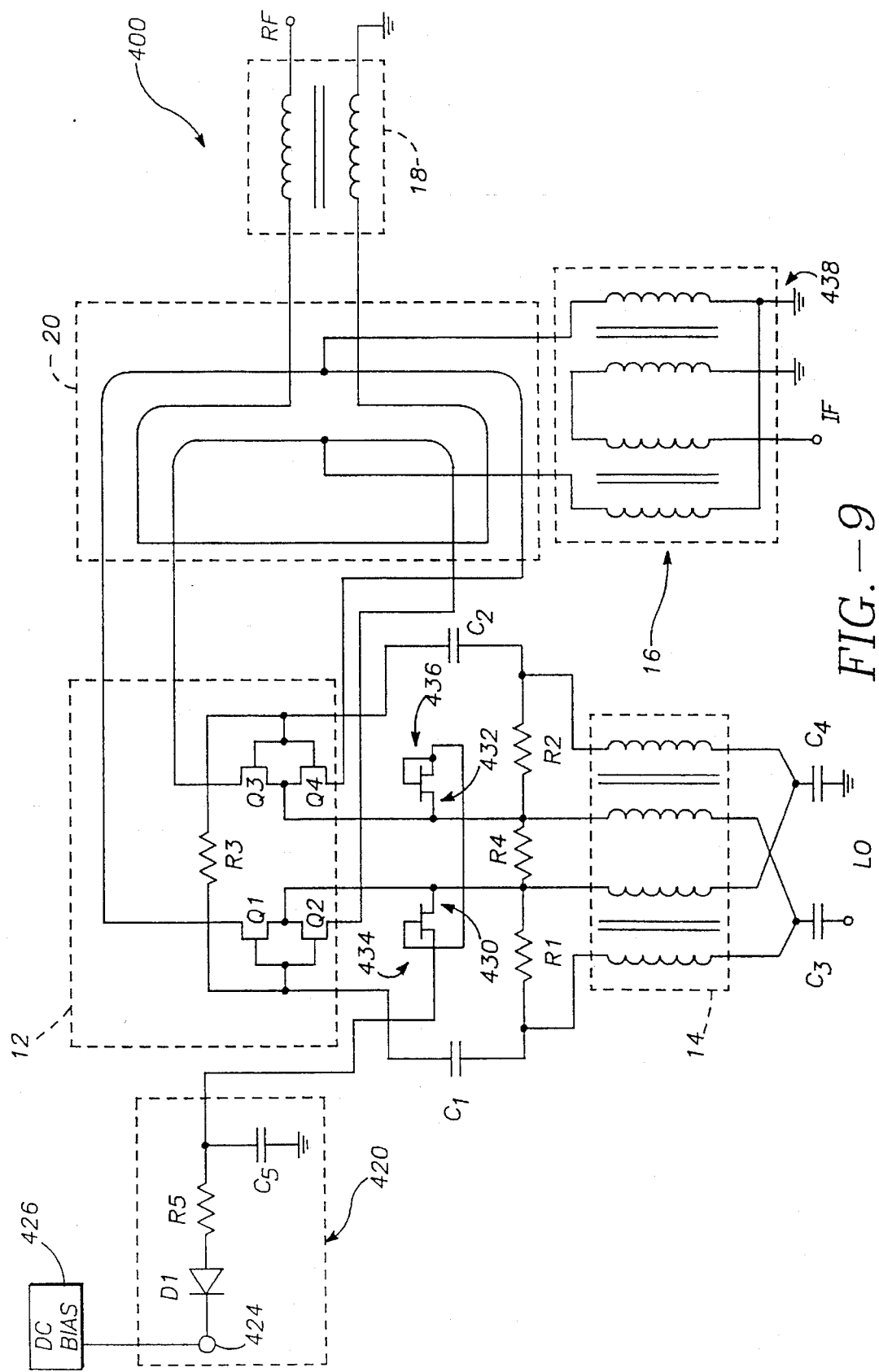
FIG.—9

BIASED FET MIXER

This application is a continuation-in-part of application Ser. No. 08/004,234, filed Jan. 14, 1993, now Pat. No. 5,361,409, which is a file-wrapper continuation application of application Ser. No. 07/668,248 filed Mar. 12, 1991, now abandoned.

BACKGROUND OF THE INVENTION

1. Field of the Invention

This invention relates generally to radio frequency communication devices and more specifically to mixers requiring relatively low local oscillator power levels and having high third order intercepts.

2. Description of the Prior Art

The dynamic range of many prior art microwave front-ends is controlled by the single and two-tone intermodulation levels of a Schottky diode mixer. (S. Weiner, D. Neuf, S. Spohrer, "2 to 8 GHZ Double Balanced MESFET Mixer With +30 dBm Input 3rd Order Intercept," 1988 *IEEE MTT-S Digest*, pp. 1097–1099.) A typical Schottky mixer obtains third order intercept points approximately equal to the local oscillator (LO) power minus the conversion loss plus 10-dB. The popular diode-ring double-balanced mixer often requires the LO power to exceed the signal compression level by 6-dB. Trade-offs between LO power levels and third order intercept and one dB compression points are inevitable, even in multiple diode schemes attempting to improve isolation, bandwidth, and single-tone intermodulation levels. Low distortion mixing is known to be possible with small amounts of LO power when an unbiased channel of a GaAs MESFET is used as the mixing element. (See, Stephen A. Maas, "A GaAs MESFET Balanced Mixer With Very Low Intermodulation," 1987 *IEEE MTT-S Digest*, pp. 895–896.) Weiner, et al., describe both single and double balanced mixers that use GaAs MESFETs instead of diodes. These mixers operate over a two to eight GHz range and obtain third order intercepts greater than +28 dBm at an LO power input of +23 dBm, with typical conversion loss of 8-dB, and an LO to radio frequency (RF) isolation greater than 25-dB. Weiner, et al., explain that previous designs using MESFETs had been limited by the LO balun and intermediate frequency (IF) transformer. These limitations were overcome by using a ring of GaAs MESFETs and tapered microstrip baluns in novel single and double balanced configurations to achieve multi-octave bandwidths. However, the bandwidth of these units is limited by the MESFET package parasitic reactances used in the ring. Weiner, et al., indicate that their future experiments will include a monolithic MESFET Quad with special gate geometry designed to improve the third order distortion, and wire-bonding of the FET to an alumina substrate to minimize parasitic reactances.

The Siliconix Si8901-DBM is a monolithic quad-MOSFET ring demodulator/mixer that is reported to achieve third-order intercepts exceeding +37 dBm and 2-dB signal overload compression and desensitization of +30 dBm at a LO drive level of +17 dBm (50 mW). (Ed Oxner, "High Dynamic Range Mixing With The Si8901," March 1988, pp. 10–11.) The Si8901 comes in a hermetic TO-99 package and a surface mount SO-14 package. The Si8901 commutation-mixer relies on the switching action of the quad-MOSFET elements to effect a mixing action. The MOSFETs act, essentially, as a pair of switches reversing the phase of a signal at a rate determined by the LO frequency. The MOSFETs exhibit a finite on-resistance that is expressed as a conversion efficiency loss. The loss results from the $r_{ds(on)}$ of the MOSFETs relative to both the signal and IF impedances and signal conversion to unwanted frequencies.

The dynamic range of existing FET mixers is a function both of the quiescent DC operating point of the FET devices included therein, as well as of the LO drive level. Conventional DC bias techniques, including those involving the application of externally-supplied DC gate voltages, have required substantial LO drive levels in applications requiring significant dynamic range. This has generally required the inclusion of relatively high-power RF amplifiers in the "pumping" circuits used to generate the LO drive signals, often resulting in increased circuit cost and complexity.

OBJECTS OF THE INVENTION

It is therefore an object of this invention to produce a radio frequency mixer that has a wide dynamic range of operation and low overall signal distortion.

It is a further object of this invention to produce a radio frequency mixer operative over a wide dynamic range at reduced LO drive levels.

SUMMARY OF THIS INVENTION

Briefly, a mixer of this invention comprises a "reflection" transmission line transformer having at least first and second ports. The ports are connected such that nearly complete coupling of a signal between the ports relies on substantially complete reflection of energy at a reference plane of the transformer. In a preferred embodiment there is produced at the first port an intermediate frequency (IF) signal and received a DC bias signal via an IF balun. At the second port there is inputted a radio frequency (RF) signal through an RF balun.

The DC bias signal will preferably be provided to a set of phase-selecting GaAs MESFET transistors operatively connected between an LO balun and a third port of the reflection transformer. In an exemplary implementation the MESFET transistors are realized using an MMIC.

An advantage of this invention is that an improved dynamic signal range is exhibited.

Another advantage of this invention is that lower distortion results in the intermediate frequency signal.

Another advantage of this invention is that the third order two tone intercept point is substantially better than a diode mixer for identical levels of local oscillator drive.

Yet another advantage of this invention is that operation over a wide dynamic range at reduced LO drive levels is exhibited.

These and other objects and advantages of this invention will no doubt become obvious to those of ordinary skill in the art after having read the following detailed description of the preferred embodiments which are illustrated in the various drawing figures.

IN THE DRAWINGS

FIG. 9 is a schematic diagram of a fourth alternate embodiment of the mixer of this invention.

DETAILED DESCRIPTION OF THE PREFERRED EMBODIMENTS

Figure 1:
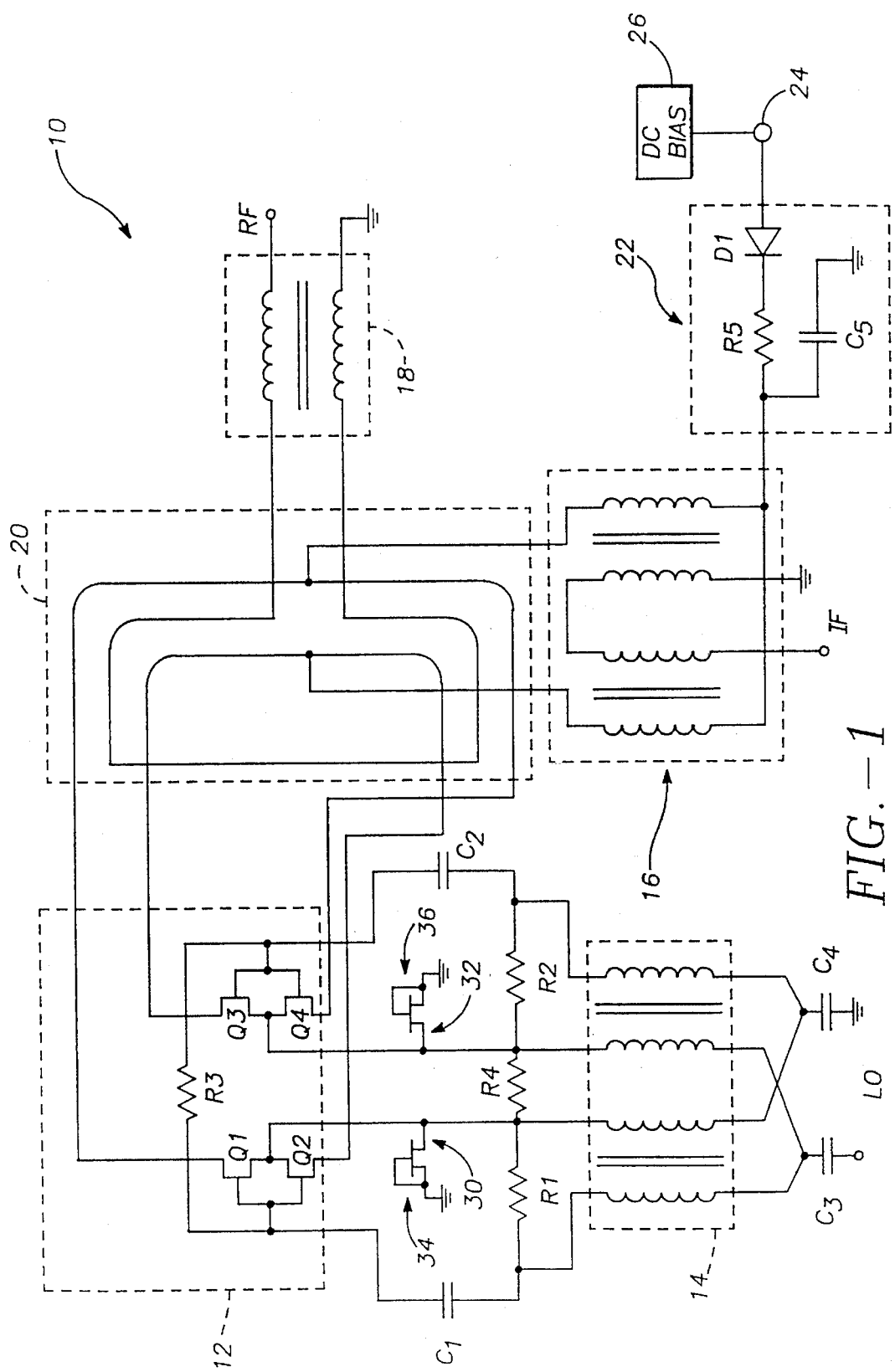
FIG. 1 is a schematic diagram of a preferred embodiment of the mixer of this invention.

FIG. 1 schematically illustrates a preferred embodiment of the mixer 10 of this invention, comprising a four-transistor circuit 12 preferably implemented as a monolithic microwave integrated circuit (MMIC). The mixer 10 further includes a local oscillator (LO) balun 14, an intermediate frequency (IF) balun 16, a radio frequency (RF) balun 18, and a reflection transformer 20. A DC bias network 22 is connected to an input port of the IF balun 16, and includes an input terminal 24 upon which is impressed a DC bias voltage by a source of DC bias 26. In an exemplary physical realization the mixer 10 is mounted within an industry standard "flat pack" hermetic Kovar package.

In what follows transformer 20 is referred to as a "reflection transformer," and such a term is new to the art. A reflection transformer is defined herein to mean any transmission line transformer that relies on a nearly complete reflection of energy at some reference plane of the transformer to achieve substantially complete coupling of said energy between its two or more distinct terminals or ports. The reflection transformer 20 comprises trifilar windings on a two-hole ferrite core or toroid.

Referring to FIG. 1, LO balun 14 is operatively coupled to the MMIC 12 through a pair of capacitors C1 and C2. Impedance matching is provided by a pair of 100Ω resistors R1 and R2 connected across LO balun 14. In addition, MMIC 12 is seen to comprise four GaAs MESFET transistors Q1, Q2, Q3, and Q4. As is indicated by FIG. 1, the DC bias supplied by the source 26 is provided to the four transistors Q1, Q2, Q3, and Q4 by way of the reflection transformer 20. First and second DC return paths 30 and 32 are connected to the MMIC 12, and include first and second DC bias transistors 34 and 36, respectively. Blocking capacitors C3 and C4 prevent leakage of DC bias current through the input port of LO balun 14. In accordance with the invention, such DC biasing of the transistors Q1, Q2, Q3, and Q4 allows for mixer operation over a wide dynamic range without requiring provision of increased levels of LO drive. In this way the mixer of the invention obviates the need for complex, high-power LO driver amplifiers.

Again referring to FIG. 1, the development of a drain-to-source bias current within the transistors Q1, Q2, Q3, and Q4 (i.e., Q1–Q4) is aided by the DC bias transistors 34 and 36. The transistors 34 and 36 are made to serve as current sources by being placed in saturation via the indicated common gate/source configuration. The maximum drain current of the transistors Q1–Q4 is thus limited by the saturation current $I_{dss}$ of the bias transistors 34 and 36, where $I_{dss}$ is substantially independent of bias voltage over a predefined range. In an exemplary embodiment the transistors 34, 36 are selected from those having $I_{dss}$ characteristics of between 23 and 30 mA, and which exhibit high drain impedance over the entire range of LO input frequencies when saturated. In an alternate implementation a pair of resistors of equal value (e.g., 50Ω) may be utilized in lieu of the bias transistors 34 and 36. In this way the common-source potentials of transistors Q1 and Q2, and of transistors Q3 and Q4, are made to vary symmetrically as a function of bias current. Although in yet other implementations the DC return paths 30 and 32 may be realized as short circuit connections to ground from the source nodes of Q1, Q2, Q3 and Q4, the dynamic range of the mixer 10 will generally be improved by allowing the potentials of these source nodes to float above ground.

Again referring to FIG. 1, the bias network 22 includes a reverse protection diode D1, a bias resistor R5, and a bypass capacitor C5. Capacitor C5 prevents high-frequency power supply noise from being injected into the input port of IF balun 16 by providing a shunt path to ground, while reverse protection diode D1 protects the circuit 10 from damage in the event of accidental application of a reverse-bias voltage. The value of the resistor R5 included within the bias network 22 will generally be selected upon the basis of the noise figure of the transistors Q1–Q4, as well as upon the intercept points characteristic of the mixer 10. It is expected that the noise figure of the transistors Q1–Q4 will generally be degraded in proportion to the magnitude of the DC bias current, while the $3^{rd}$ order mixer intercept point will be optimized at relatively high levels of DC bias. In an exemplary implementation in which a DC bias voltage of 5 V is provided by the DC bias source 26, the values of R5 and C5 are selected to be 25Ω and 0.01 µF, respectively.

Resistors R3 and R4 are intended to further aid in the development of an optimum DC bias on the gates of transistors Q1, Q2, Q3, and Q4. Specifically, an additional DC bias voltage is made to self-develop in transistors Q1, Q2, Q3, and Q4 by virtue of a small, but significant, amount of intentional forward-biased gate current.

Figure 2:
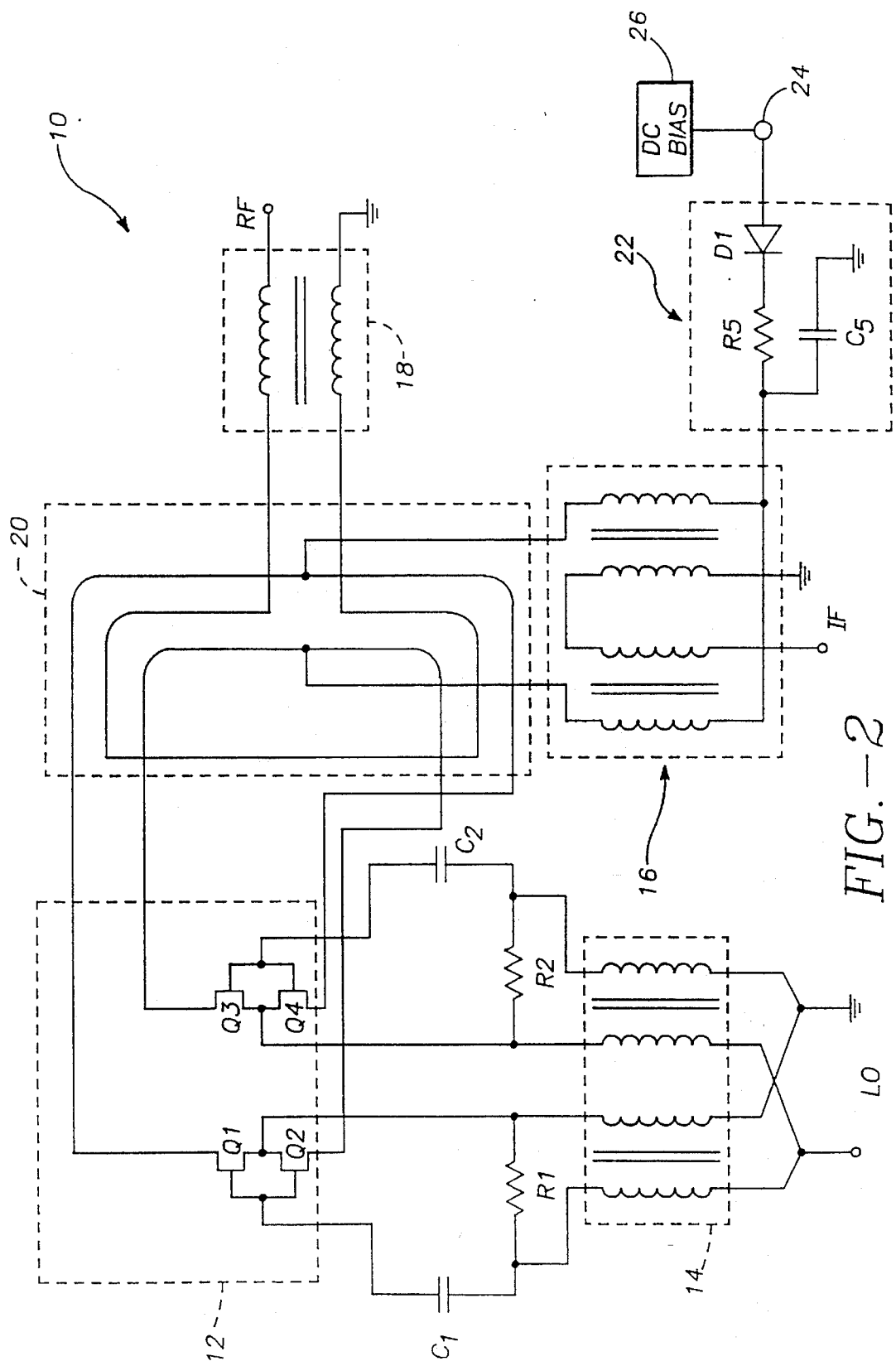
FIG. 2 is a schematic diagram of a first alternate embodiment of the mixer of this invention.

FIG. 2 is a schematic representation of a first alternate embodiment of the mixer 100 of this invention. The mixer 100 is substantially similar to the preferred embodiment of the mixer 10, with the exception that the DC bias current through transistors Q1, Q2, Q3 and Q4 is returned to ground via the input port of LO balun 14 rather than through the DC return paths 30 and 32. Accordingly, neither the DC blocking capacitors C3 and C4 nor the DC bias transistors 34 and 36 are included within the alternate embodiment of the mixer 100. The resistors R3 and R4 are also not included within the embodiment of the mixer depicted in FIG. 2.

Figure 3:
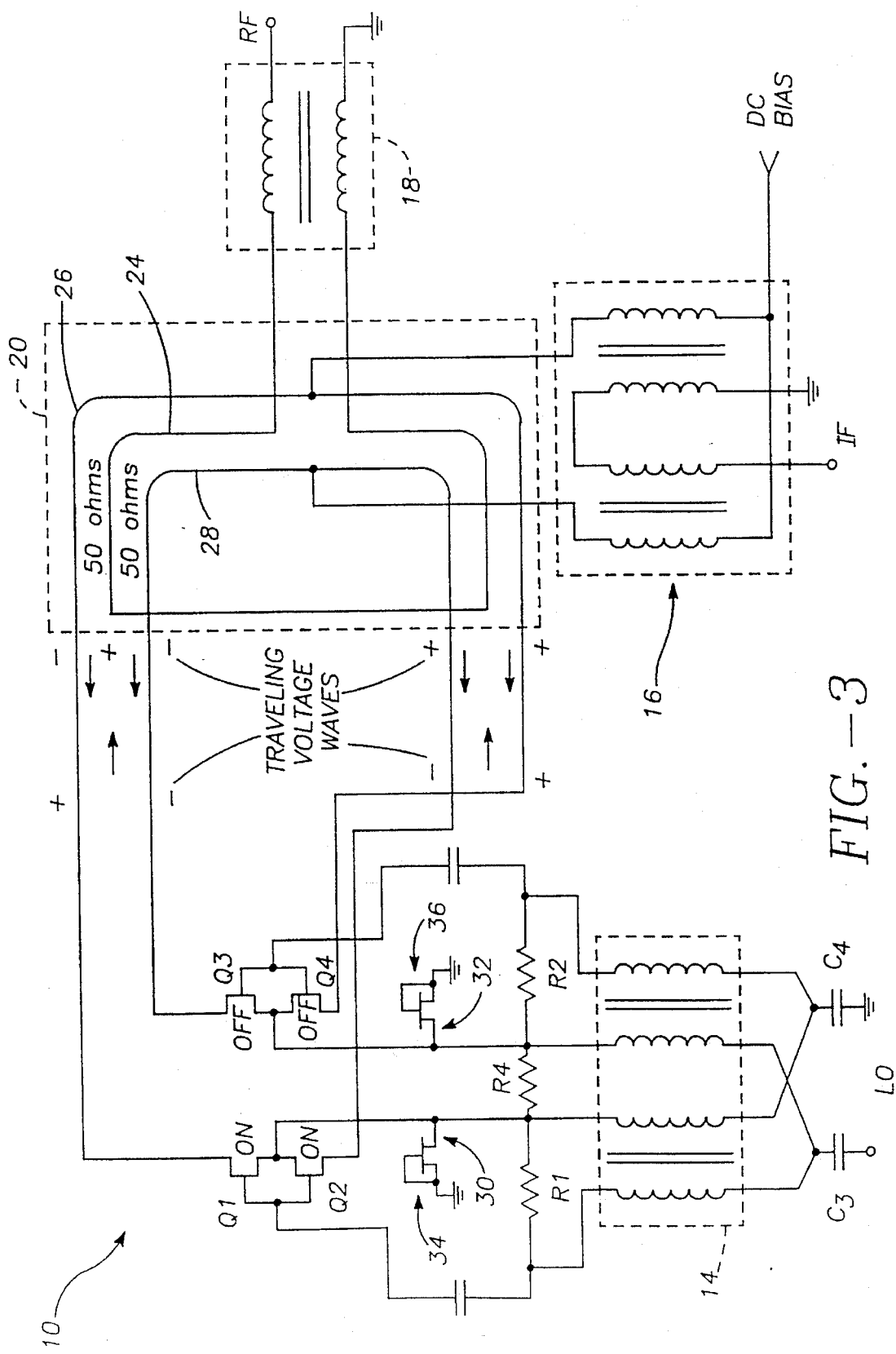
FIG. 3 is a schematic diagram of the traveling waves incident to and reflected from the MMIC in a first state.
Figure 4:
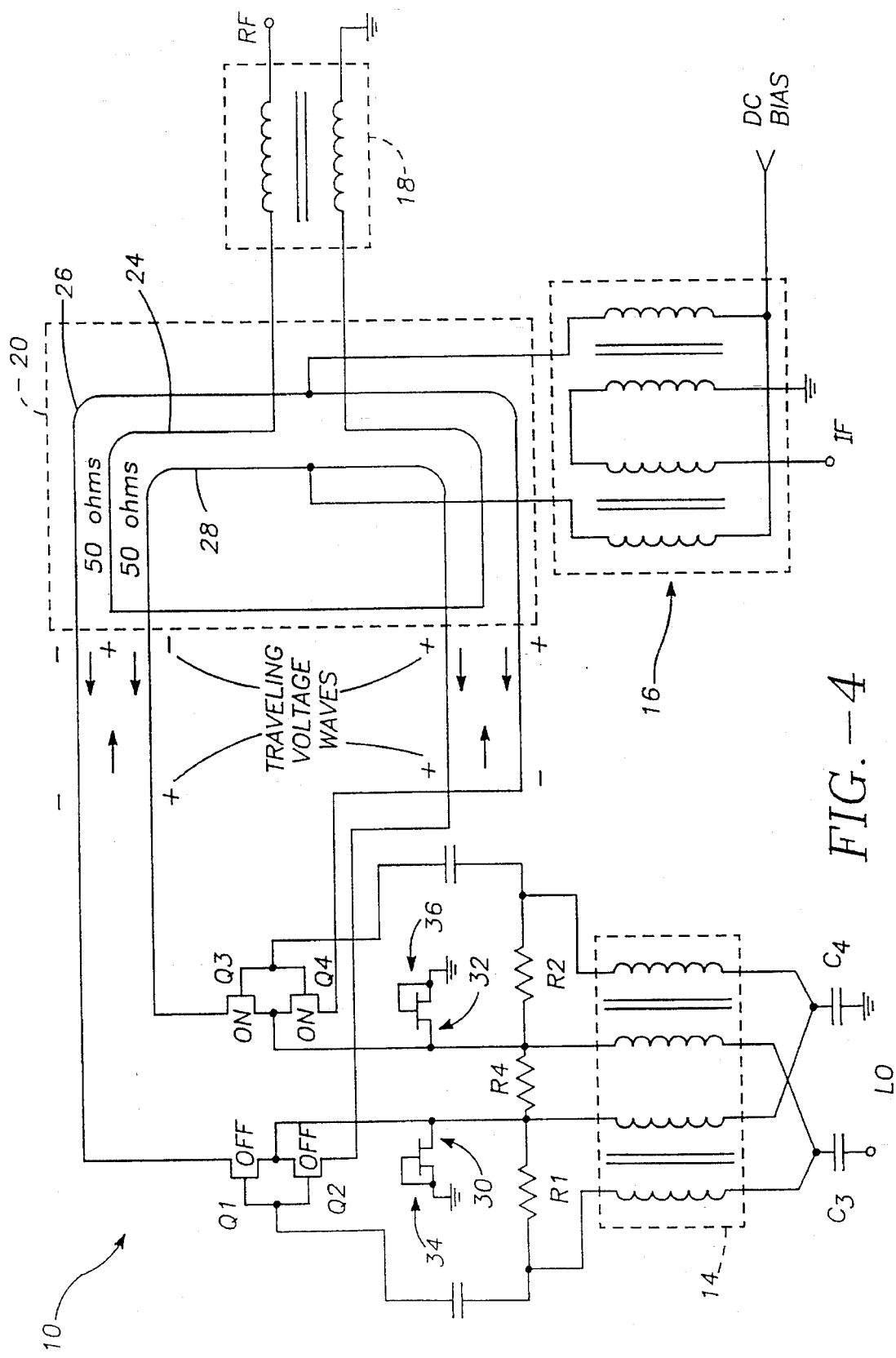
FIG. 4 is a schematic diagram of the traveling waves incident to and reflected from the MMIC in a second state opposite to the first.

FIGS. 3 and 4 illustrate the switching action of transistors Q1, Q2, Q3, and Q4 in response to an LO signal input. LO balun 14 will present a 50Ω impedance to the LO because resistors R1 and R2 are seen in parallel and represent the principal components of the input impedance. LO balun 14 is wound such that the LO signal is 180° out of phase between the gates of Q1 and Q2 and the gates of Q3 and Q4. Transistors Q1, Q2, Q3, and Q4 do not operate in their linear regions for any significant time and will either be fully ON or fully OFF. FIG. 3 illustrates when Q1 and Q2 are ON and Q3 and Q4 are OFF. FIG. 4 illustrates the opposite condition when Q1 and Q2 are OFF and Q3 and Q4 are ON. Either way, transistors Q1, Q2, Q3, and Q4 will not present a 50Ω impedance to reflection transformer 20. Incoming RF signals from RF balun 18 will cause a winding 24 to induce a signal into a pair of windings 26 and 28. These signals travel out reflection transformer on both top and bottom branches of windings 26 and 28 to transistors Q1, Q2, Q3, and Q4, where they then reflect back to the mid-point where IF balun 16 taps into reflection transformer 20. The relative phase angle of the signals seen by IF balun 16 will depend on whether transistor pair Q1 and Q2 are ON or transistor pair Q3 and Q4 are ON. (If Q1 and Q2 are ON, Q3 and Q4 must be OFF, and vice versa.) The LO input signal is therefore caused to beat against the RF input signal with the products (RF, LO, RF−LO, and RF+LO) appearing as the IF output signal. (The RF and LO product terms are considerably suppressed by virtue of the balanced topology and are therefore insignificant.) Mixer 10 has a very high third-order two-tone intercept point. (Those skilled in the art will be familiar with the use of the third-order two-tone intercept point as a measure of a figure of merit for a mixer.)

Figure 5:
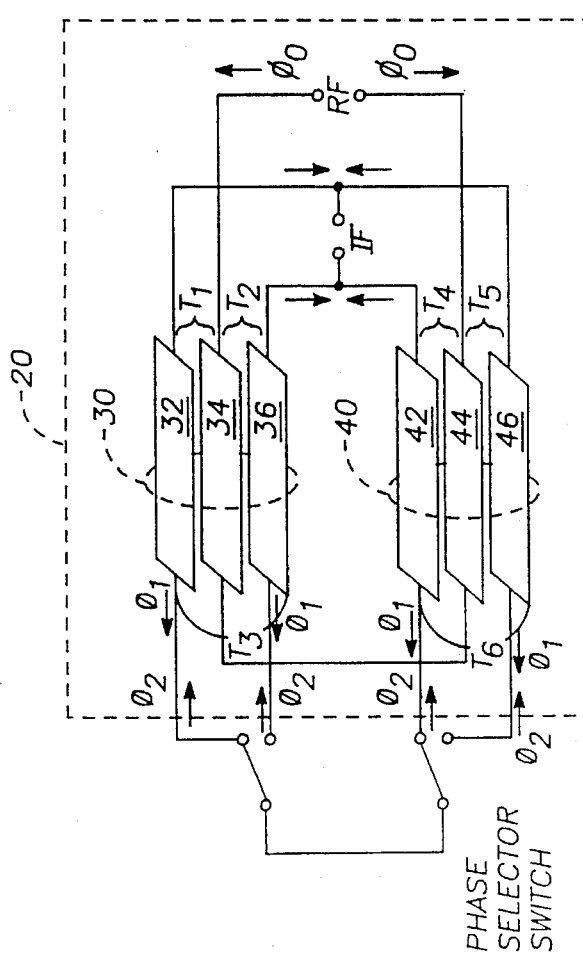
FIG. 5 is a schematic diagram of the reflection transformer and emphasizes the transmission line segment nature of the trifilar windings.

FIG. 5 illustrates a conceptual view of the reflection transformer 20 as comprising six transmission line segments $T_1$–$T_6$. A trifilar wire 30 comprises three individual wires 32, 34, and 36. Transmission line segment $T_1$ is comprised of wires 32 and 34, and transmission line segment $T_2$ is comprised of wires 34 and 36. Wires 32 and 36 comprise transmission line segment $T_3$. A trifilar wire 40 comprises three individual wires 42, 44, and 46. Transmission line segment T4 is comprised of wires 42 and 44, and transmission line segment $T_5$ is comprised of wires 44 and 46. Wires 42 and 46 comprise transmission line segment $T_6$. For purposes of explanation only, a phase selector switch in FIG. 5 replaces the four MESFETs of FIGS. 2–4 at a phase switching port of transformer 20. The input signal is applied at an RF port and output is taken at an IF port. (The labels "RF port" and "IF port" owe their relevance to the mixer application of the reflection transformer and can alternatively be replaced by the labels "primary port" and "secondary port," respectively.) The several transmission lines $T_1$–$T_6$ behave substantially in the manner shown in Table I, wherein phase shift along the transmission lines $T_1$–$T_6$ has been neglected for clarity of presentation.

TABLE I

| T | Z | $\phi_0$ | $\phi_1$ | $\phi_2$ | $\phi_3$ |
|---|---|---|---|---|---|
| $T_1$ | $Z_0$ | 0° | 180° | 0° | 0° |
| $T_2$ | $Z_0$ | 0° | 180° | 180° | 180° |
| $T_3$ | $2Z_0$ | | | | |
| $T_4$ | $Z_0$ | 180° | 0° | 180° | 180° |
| $T_5$ | $Z_0$ | 180° | 0° | 0° | 0° |
| $T_6$ | $2Z_0$ | | | | |

Each transmission line $T_1$–$T_6$ has a characteristic impedance ($Z_{T1}$–$Z_{T6}$) equal to the system impedance of $Z_0$ (preferably 50Ω) or equal to two times $Z_0$. The combined parallel impedance of $T_1$ and $T_2$ (and also $T_4$ and $T_5$) is $Z_0/2$. The impedance from the RF port, i.e., $Z_{RF}$, consists of the combined parallel impedance of $T_1$ and $T_2$ in series with the combined parallel impedance of $T_4$ and $T_5$, which results in $Z_{RF}=Z_0$. The impedance from the IF port, i.e., $Z_{IF}$, consists of $Z_{T3}$ in parallel with $Z_{T6}$, where:

$Z_{T3}=Z_{T1}+Z_{T2}=2Z_0$, and $Z_{T6}=Z_{T4}+Z_{T5}=2Z_0$, so that $Z_{IF}=Z_0$ Thus, the transformer is matched to a system impedance of $Z_0$ at both the RF and IF ports. The incident wave relative phase angle at the RF port is represented by $\phi_0$ and is expressed in degrees, while the incident wave relative phase angle at the phase switching port is represented by $\phi_1$ and is also expressed in degrees. The reflected wave relative phase angle at the phase switching port is represented by $\phi_2$ and is expressed in degrees. The resultant relative phase angle at the IF output port is represented by $\phi_3$ and is also expressed in degrees.

Figure 6:
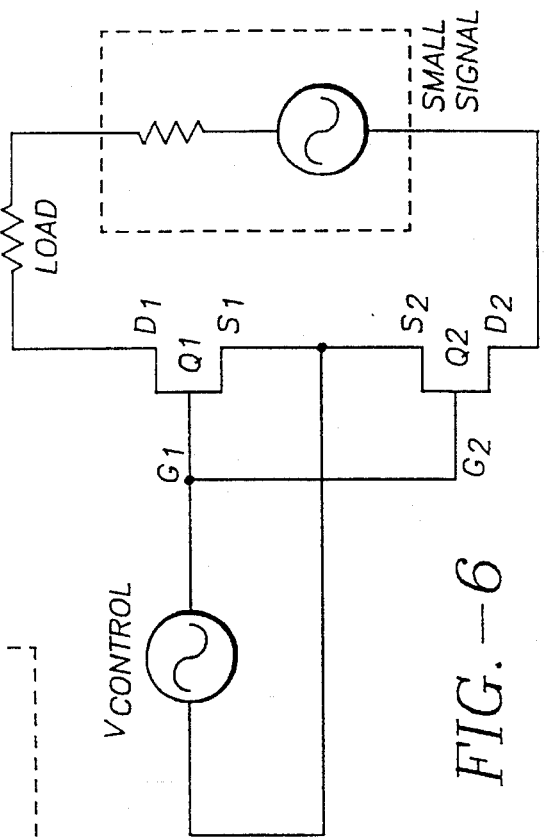
FIG. 6 is a schematic of a pair of back-to-back FETs used as a model to explain how this invention reduces intermodulation distortion in the preferred embodiment.

FIG. 6 illustrates how back-to-back FETs help cancel intermodulation distortion. Specifically, the small signal current flowing through transistors Q1 and Q2 induces voltages of opposite polarity to develop at drain nodes D1 and D2 with respect to the common source node (S1, S2). As a consequence, the perturbations in resistance produced in the channels of Q1 and Q2 are oriented in opposite directions and hence are at least partially offsetting. Hence, the small signal passing through the channels of Q1 and Q2 has a reduced effect upon the overall device resistance in series with the load, which results in decreased intermodulation distortion.

The foregoing may be expressed quantitatively by the following set of equations, in which $R_{ds}$ denotes FET channel resistance, $V_{gs}$ represents FET gate-to-source voltage, $V_{gd}$ denotes FET gate-to-drain voltage, and $V_{control}$ represents the applied FET gate voltage. The channel resistance $R_{ds}$ may be generally expressed as:

$$R_{ds}=R^0{}_{ds}+C_1\Delta V_{gd}+C_2(\Delta V_{gd})^2+\ldots$$

where the channel resistance component $R^0{}_{ds}$, and constants $C_1, C_2, \ldots$, are exclusively a function of $V_{control}$.

$$R_{d_1d_2} = R_{d_1s_1} + Rd_2s_2$$
$$= R^0{}_{d_1s_1} + C_1\Delta V_{g_1d_1} + C_2(\Delta V_{g_1d_1})^2 + \ldots +$$
$$R^0{}_{d_2s_2} + C_1\Delta V_{g_2d_2} + C_2(\Delta V_{g_2d_2})^2 + \ldots$$

for small values of $\Delta V_{gd}$, $$R_{d_1d_2} \propto (R^0{}_{d_1s_1}+R^0{}_{d_2s_2})+C_1(\Delta V_{g_1d_1}+\Delta V_{g_2d_2})$$

Referring to FIG. 6, $$V_{g_1d_1}=V_{g_1s_1}+V_{s_1d_1}$$

$$V_{g_2d_2}=V_{g_2s_2}+V_{s_2d_2}$$

$$R_{d_1d_2}=(R^0{}_{d_1s_1}+R^0{}_{d_2s_2})+C_1[\Delta(V_{g_1s_1}+V_{s_1d_1})+\Delta(V_{g_2s_2}+V_{s_2d_2})]$$

If it is assumed that transistors Q1 and Q2 have approximately matching transfer characteristics, then $$R^0{}_{d_1s_1} \propto R_{d_2s_2} \text{ and } V_{s_1d_1} \propto -V_{s_2d_2}$$

In addition, $$V_{g_1s_1}+V_{g_2s_2}=2V_{control}$$

which is substantially invariant to fluctuation in RF signal level. Accordingly, $$R_{d_1d_2} \propto 2R^0{}_{d_1s_1}$$

Figure 7:
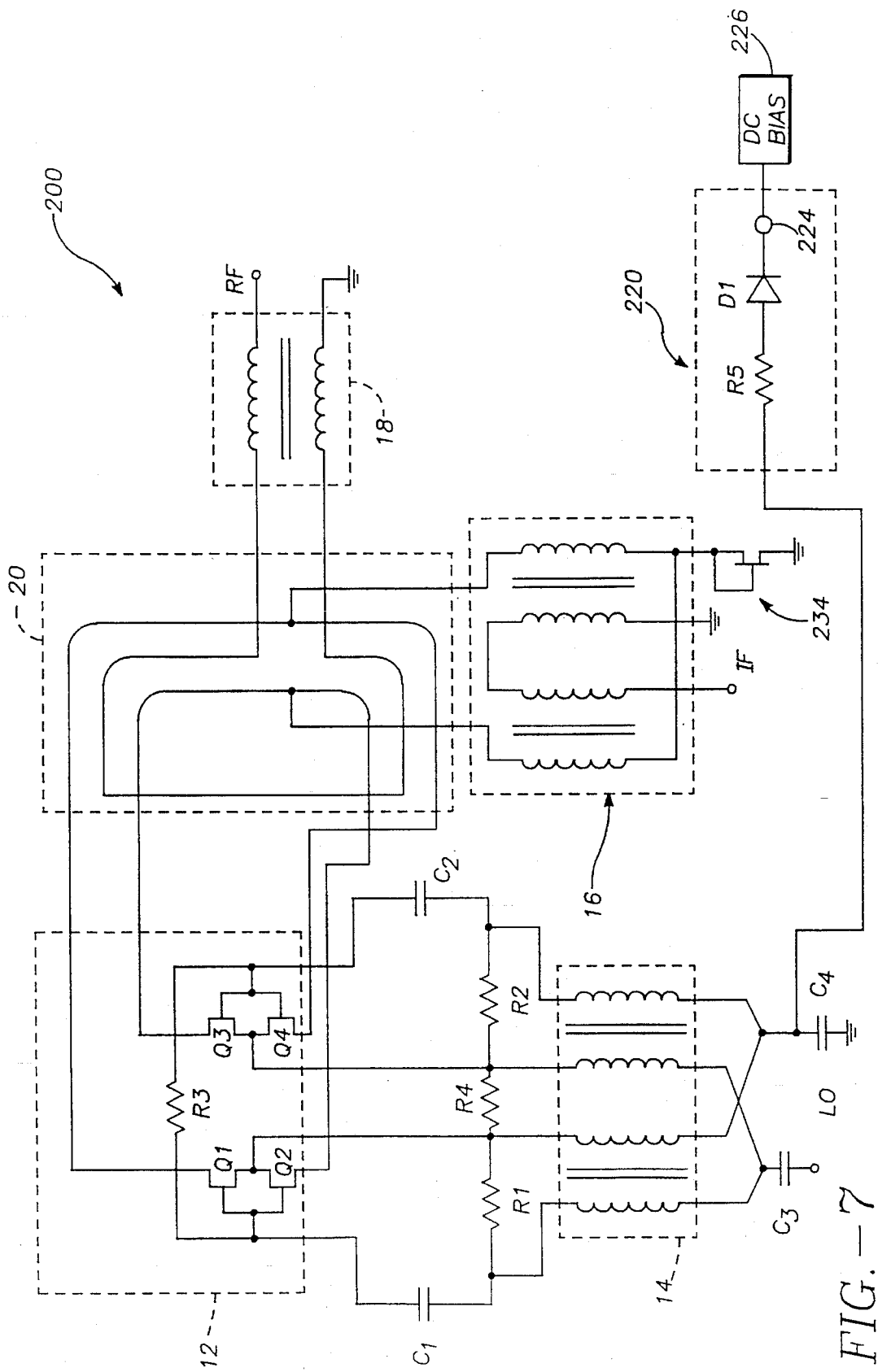
FIG. 7 is a schematic diagram of a second alternate embodiment of the mixer of this invention.

FIG. 7 is a schematic representation of a second alternate embodiment of the mixer 200 of this invention. The mixer 200 is substantially similar to the preferred embodiment of the mixer 10, with the exception that DC bias to transistors Q1, Q2, Q3 and Q4 is provided through the LO input port rather than through than the IF input port. Specifically, a DC bias network 220 is connected to LO balun 14 and to capacitor C4, and includes an input terminal 224 upon which is impressed a DC bias voltage by a source of DC bias 226 of opposite polarity to that of source 26 (FIG. 1). As in the case of the bias network 22 described above, the bias network 220 includes a reverse protection diode D 1, and a bias resistor R5. Bypass capacitor C5 is not included within the bias network 220 as its function is performed by capacitor C4. A DC return path 230 is connected to IF balun 16, and is seen to include a DC bias field-effect transistor (FET) 234.

Figure 8:
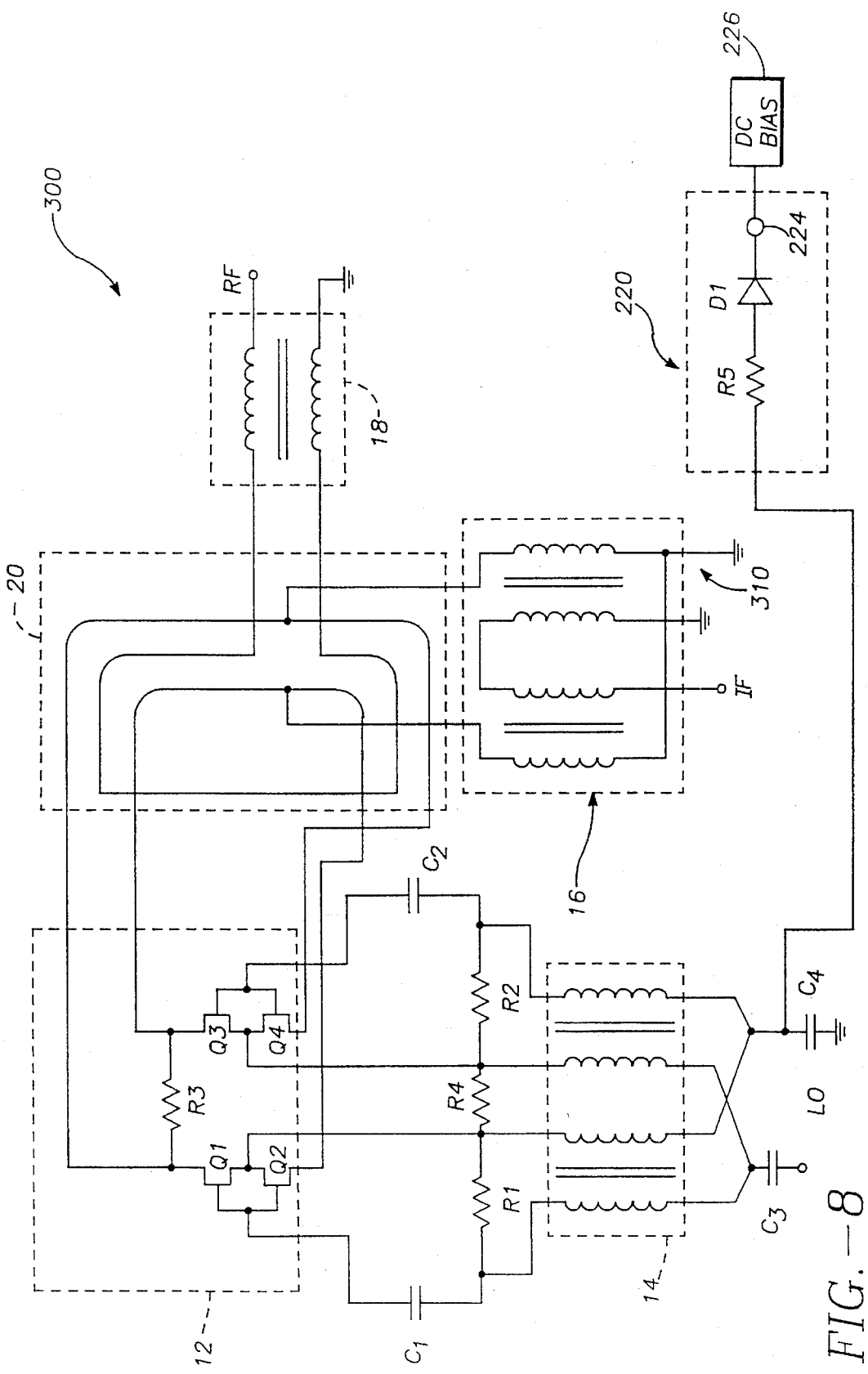
FIG. 8 is a schematic diagram of a third alternate embodiment of the mixer of this invention.

FIG. 8 is a schematic representation of a third alternate embodiment of the mixer 300 of this invention. The mixer 300 is substantially similar to the embodiment of the mixer 200 (FIG. 7), with the exception that DC bias return path 310 comprises a short circuit rather than an FET 234.

FIG. 9 is a schematic representation of a fourth alternate embodiment of the mixer 400 of this invention. The mixer 400 is substantially similar to the embodiment of the mixers 200 (FIG. 7) and 300 (FIG. 8), with the exception that DC bias is injected therein via first and second current paths 430 and 432. As shown in FIG. 9, the first and second current paths include first and second bias FET's 434 and 436, respectively. The first bias FET 434 couples DC bias network 420 to the common source node of Q1 and Q2, while the second bias FET 436 links the network 420 to the common source node of Q3 and Q4. DC bias network 420 includes an input terminal 424 upon which is impressed a DC bias voltage by a source of DC bias 426. As in the case of the bias network 22 described above, the bias network 420 includes a reverse protection diode D1, a bias resistor R5, and a bypass capacitor C5.

Although this invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A DC-biased reflection transformer, comprising:

a transmission line transformer having at least two ports, said ports connected such that nearly complete coupling of energy between said ports relies on substantially complete reflection of said energy at a reference plane of the transformer, said DC-biased reflection transformer further including phase selector switch means for inducing said substantially complete reflection of energy at said reference plane by switchably creating an impedance mismatch at a first end of a transmission line connected to at least one of said two ports, said reflection transformer being disposed to receive a DC bias signal through one of said ports from a DC bias network coupled thereto.

2. The transformer of claim 1, wherein:

said one of said ports comprises means for outputting an intermediate frequency (IF) signal;

another of said ports comprises means for inputting a radio frequency (RF) signal; and said reference plane of the transformer comprises a third port of the transformer connected to said phase selector switch means.

3. The transformer of claim 2, wherein:

said phase selector switch means is responsive to a local oscillator (LO) frequency and includes at least one switching element biased by said DC bias signal; and said complete reflection of energy at a reference plane of the transformer comprises a first reflection and a second reflection at said first end of said transmission line, the first reflection coincident with a first phase of said LO frequency and said second reflection coincident with a second phase of said LO frequency.

4. The transformer of claim 1, wherein:

the transformer is comprised of a plurality of transmission lines which transmit energy from a radio frequency (RF) port to an intermediate frequency (IF) port of the transformer.

5. The transformer of claim 4, wherein:

said complete reflection of energy at a reference plane of the transformer occurs at a phase selector switch connected to a phase switching port of the transformer; and said transmission lines comprise a first through a sixth transmission line, the transformer belonging to a system that has a system impedance of $Z_0$, said first, second, fourth, and fifth transmission lines having a transmission line characteristic impedance of $Z_0$, said third and sixth transmission lines having a transmission line characteristic impedance of two times $Z_0$, said first transmission line such that a zero degree incident wave relative phase angle at said RF port and a 180° phase angle of reflection at said phase switching port causes a resultant relative phase angle of approximately 0° at said IF port;

said second transmission line such that a zero degree incident wave relative phase angle at said RF port and a zero degree phase angle of reflection at said phase switching port causes a resultant relative phase angle of approximately 180° at said IF port;

said fourth transmission line such that a 180° incident wave relative phase angle at said RF port and a 180° phase angle of reflection at said phase switching port causes a resultant relative phase angle of approximately 180° at said IF port; and said fifth transmission line such that a 180° incident wave relative phase angle at said RF port and a zero degree phase angle of reflection at said phase switching port causes a resultant relative phase angle of approximately 0° at said IF port.

6. A DC-biased mixer, comprising:

a first and a second FET transistor each having a gate and a first drain/source and a second drain/source, the first and second FET transistors having their gates tied to one another and said first drain/source of the first FET transistor connected to said first drain/source of the second FET transistor;

a third and a fourth FET transistor each having a gate and a first drain/source and a second drain/source, the third and fourth FET transistors having their gates tied to one another and said first drain/source of the third FET transistor connected to said first drain/source of the fourth FET transistor;

a DC bias network for providing DC bias to said second drain/source of the first, second, third, and fourth FET transistors;

a local oscillator (LO) balun having a first output port in electrical communication with said gates belonging to the first and second FET transistors and a second output port in electrical communication with said gates belonging to the third and fourth FET transistors; and a reflection transformer coupled to said first, second, third, and fourth FET transistors, said reflection transformer comprising a transmission line transformer having at least two ports wherein said DC bias is applied to one of said two ports, said ports connected such that nearly complete coupling of energy between said ports relies on substantially complete reflection of said energy at a reference plane of the transformer, said substantially complete reflection of energy at said reference plane resulting from an impedance mismatch at a first end of a transmission line connected to at least one of said two ports wherein an RF signal and an intermediate-frequency (IF) signal each pass through a different one of said two ports.

7. The mixer of claim 6, further comprising
a first capacitor connected in series with said first output port of the LO balun and with said gates belonging to the first and second FET transistors; and
a second capacitor connected in series with said second output port of the LO balun and with said gates belonging to the third and fourth FET transistors.

8. The mixer of claim 6, wherein:
the reflection transformer comprises trifilar windings on a two-hole ferrite core or toroid,
said local oscillator (LO) balun includes an unbalanced input port, and
the reflection transformer comprises a radio frequency (RF) input port, a four-wire switch port, and an intermediate frequency (IF) output port, said four-wire switch port connected to said second drain/source of the first, second, third, and fourth FET transistors.

9. The mixer of claim 6, wherein:
said means for applying DC bias includes means for providing a first DC return path between a reference node and said first drain/source of the first and second FET transistors, and a second DC return path between said reference node and said first drain/source of the third and fourth FET transistors.

10. The mixer of claim 9, wherein:
said means for applying DC bias includes a first DC blocking capacitor connected to a first input node of an input port of said LO balun and a second blocking capacitor connected to a second input node of said input port of said LO balun.

11. The mixer of claim 9, wherein said first and second DC return paths each include a field effect transistor.

12. The mixer of claim 6, further comprising:
a radio frequency (RF) balun for matching the impedance of an RF source to the reflection transformer.

13. The mixer of claim 6, further comprising:
an intermediate frequency (IF) balun for matching the impedance of the reflection transformer to an IF output.

14. The mixer of claim 13, wherein said means for applying DC bias further includes a DC source connected through a DC bias network to said IF output.

15. The mixer of claim 6, wherein said reflection transformer has a characteristic impedance of $Z_0$, the reflection transformer has a radio frequency (RF) port and an intermediate frequency (IF) port and comprises first through sixth transmission line segments wherein:

said first, second, fourth, and fifth transmission lines have a transmission line characteristic impedance of $Z_0$, said third and sixth transmission lines have a transmission line characteristic impedance of two times $Z_0$, said first transmission line such that a zero degree incident wave relative phase angle at said RF port and a 180° phase angle of reflection at said phase switching port causes a resultant relative phase angle of approximately 0° at said IF port;

said second transmission line such that a zero degree incident wave relative phase angle at said RF port and a zero degree phase angle of reflection at said phase switching port causes a resultant relative phase angle of approximately 180° at said IF port;

said fourth transmission line such that a 180° incident wave relative phase angle at said RF port and a 180° phase angle of reflection at said phase switching port causes a resultant relative phase angle of approximately 180° at said IF port; and said fifth transmission line such that a 180° incident wave relative phase angle at said RF port and a zero degree phase angle of reflection at said phase switching port causes a resultant relative phase angle of approximately 0° at said IF port.

16. The mixer of claim 6, wherein:
a first DC return path exists between an input port of said LO balun and said first drain/source of the first and second FET transistors, and a second DC return path exists between said input port of said LO balun and said first drain/source of the third and fourth FET transistors.

17. The mixer of claim 6, wherein:
said means for applying DC bias includes a DC source connected through a DC bias network to an input port of said LO balun.

18. The mixer of claim 17, wherein:
said means for applying DC bias includes means for providing a DC return path at one of said ports of said reflection transformer.

19. The mixer of claim 18 wherein said DC return path includes a field effect transistor.

20. A DC-biased reflection transformer, comprising:
a transmission line transformer having at least two ports, said ports connected such that nearly complete coupling of energy between said ports relies on substantially complete reflection of said energy at a reference plane of the transformer, said DC-biased reflection transformer further including phase selector switch means for inducing said substantially complete reflection of energy at said reference plane by switchably creating an impedance mismatch at a first end of a transmission line connected to at least one of said two ports, said reflection transformer receiving a DC bias signal through a first of said ports from a DC bias network coupled thereto and said reflection transformer including means for providing an intermediate-frequency (IF) signal through a second of said ports.

* * * * *